United States Patent
Kirsch (10) Patent No.: US 7,088,157 B2
(45) Date of Patent: Aug. 8, 2006

(54) APPARATUS AND METHOD FOR FREQUENCY AND PHASE ACQUISITION

(75) Inventor: Martin Kirsch, Murrhardt (DE)

(73) Assignee: Marconi Communications GmbH, Backnang (DE)

(*) Notice: Subject to any disclaimer, the term of this patent is extended or adjusted under 35 U.S.C. 154(b) by 0 days.

(21) Appl. No.: 10/477,035

(22) PCT Filed: May 8, 2002

(86) PCT No.: PCT/IB02/02585

§ 371 (c)(1),
(2), (4) Date: May 25, 2004

(87) PCT Pub. No.: WO02/091579

PCT Pub. Date: Nov. 14, 2002

(65) Prior Publication Data

US 2004/0196068 A1    Oct. 7, 2004

(30) Foreign Application Priority Data

May 8, 2001    (DE) ................. 101 21 793

(51) Int. Cl.
*H03L 7/06* (2006.01)
*H03K 5/00* (2006.01)
(52) U.S. Cl. ..................... 327/156; 327/558
(58) Field of Classification Search .......... 327/2, 327/156–158, 147–148, 558; 331/4, 17
See application file for complete search history.

(56) References Cited

U.S. PATENT DOCUMENTS

| 4,388,598 A |   | 6/1983  | Egan |
|---|---|---|---|
| 4,486,717 A | * | 12/1984 | Yamasaki ............ 331/4 |
| 5,148,123 A | * | 9/1992  | Ries ................... 331/4 |
| 5,394,115 A |   | 2/1995  | Lampel |
| 5,414,741 A | * | 5/1995  | Johnson ........... 375/376 |
| 5,619,484 A |   | 4/1997  | Yokota et al. |
| 6,031,427 A |   | 2/2000  | Black |

FOREIGN PATENT DOCUMENTS

JP    2000049601 A    2/2000

OTHER PUBLICATIONS

*Frequency Synthesis by Phase Lock*, William F. Egan, John Wiley & Sons, Inc., 1981, S. 244-247, ISBN: 0-471-08202-3 (D4).

* cited by examiner

*Primary Examiner*—Dinh T. Le
(74) *Attorney, Agent, or Firm*—Kirschstein, et al.

(57) ABSTRACT

An apparatus for frequency and phase acquisition has a voltage-controlled oscillator and a search generator with a forward path and a backward path for generating a search signal with a search frequency, the forward path of the search generator acting as a loop filter when the frequency is locked off. The search signal is symmetrized.

17 Claims, 6 Drawing Sheets

PRIOR ART

APPARATUS AND METHOD FOR FREQUENCY AND PHASE ACQUISITION

BACKGROUND OF THE INVENTION

The invention relates to an apparatus for frequency and phase acquisition in a phase-locked loop having a voltage-controlled oscillator (VCO) and a search generator with a forward path and a backward path for generating a search signal with a search frequency, the forward path of the search generator acting as a loop filter when phase lock is attained.

The invention furthermore relates to a method for frequency and phase acquisition in a phase-locked loop, in which a search generator with a forward path and a backward path generates a search signal with a search frequency, the forward path of the search generator acting as a loop filter when phase lock is attained.

DESCRIPTION OF THE RELATED ART

Apparatuses of the generic type and methods of the generic type are employed in numerous areas, in particular in devices appertaining to modern telecommunications technology. The use of the invention in a single-loop PLL ("Phase Locked Loop") initially serves for the setting of a voltage-controlled oscillator to a reference frequency and the subsequent stabilization by phase locking.

Figure 1:
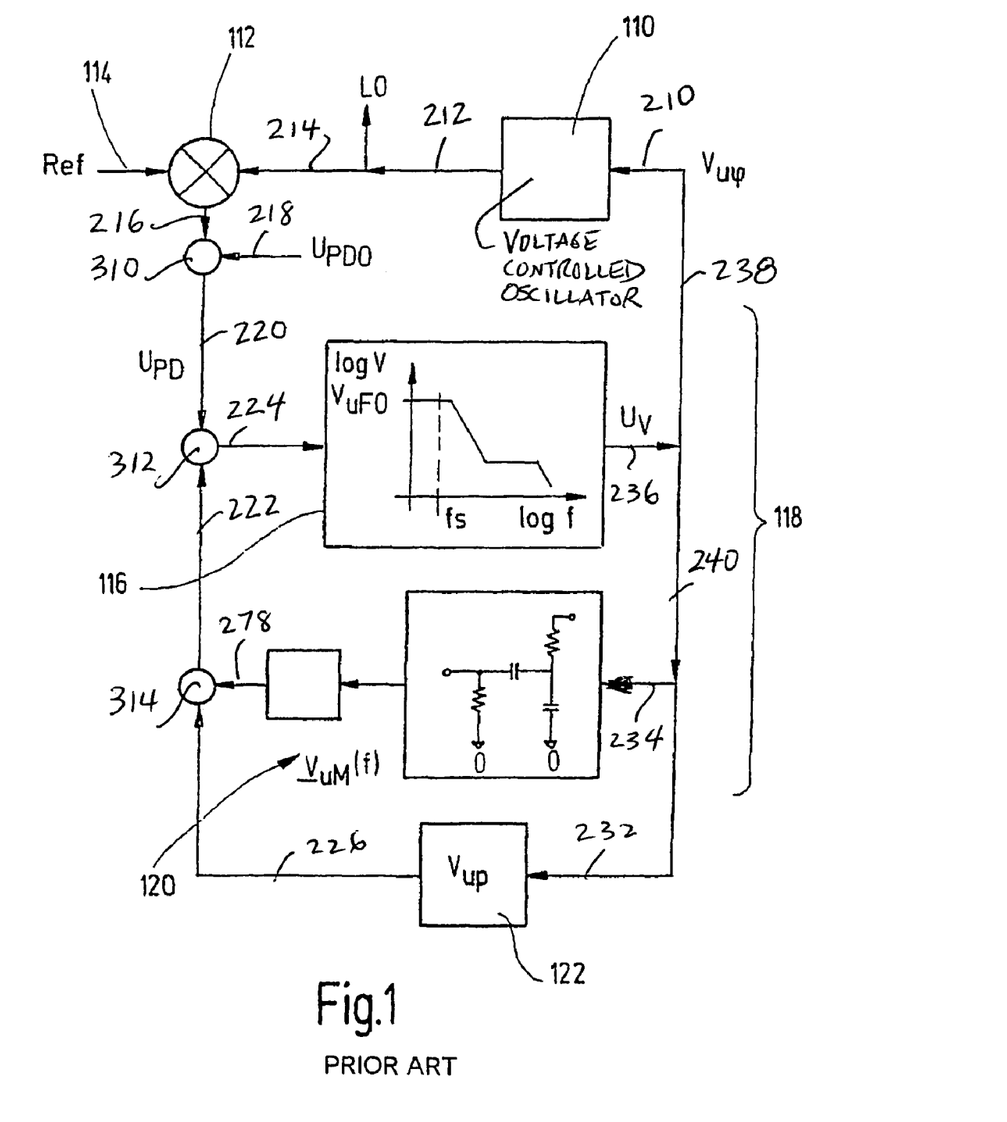
FIG. 1 is a block diagram of a prior art apparatus.

FIG. 1 shows the basic construction of a single-loop PLL of the prior art. A voltage-controlled oscillator 110 generates an output frequency whose magnitude is a function of the DC voltage $V_{u\phi}$ applies to its control input 210. The output frequency on line 212 is coupled to an output port LO and to a first input 214 of a phase detector 112. A reference frequency Ref from a reference frequency source is fed via line 114 to a second input of phase detector 112. The output of the place detector 112 is fed via line 216 to a first summer 310 and summed with offset voltage $U_{PD0}$ on line 218 to produce a resultant signal $U_{PD}$ on line 220. $U_{PD0}$ and sensor 310 have been shown as discrete elements for the purpose of analysis. voltage $U_{PD0}$ represent an unwanted parasitic offset voltage as will be discussed later.

Signal $U_{PD}$ is fed to a first input of a second summer 312 where it is added to a signal on line 222. The output of summer 312 is fed via a line 224 to an input of a frequency-dependent network 116 whose output Uv is fed via line 236 on line 238 to the input 210 of VCO 110. The output Uv is also fed via line 240 to an input 234 of a Wien bridge oscillator 120 which includes a Wien network 1210.

The output $\underline{V}$ um(f) of the oscillator 120 is fed via line 278 to a first input of a third summer 314.

Signal Uv is also coupled via line 232 to a parasitic leakage path 122. The parasitic leakage path causes a parasitic signal Vup on line 226 to be applied to a second input of summer 314. The resultant combined signal on line 222 constitutes the signal applied to the second input of the second summer referred to previously.

It is to be observed that the leakage path 122 and summer 314 have been depicted as discrete components for the purpose of circuit analysis.

The frequency-dependent network 116 and Wien oscillator 120 form a search generator 118. The frequency dependent network 116 constitutes the forward path of the search generator 118 and the Wien oscillator 120 constitutes the backward path. During the frequency acquisition the parasitic path 122 serves to couple to output Uv of the loop filter 116 to the input line 224.

During the frequency acquisition, the search generator 118 oscillates and the frequency of the VCO 110 approaches the reference frequency 114 so closely that the loop locks. The VCO 110 is then coupled to the reference 114 in a phase-locked manner within the loop bandwidth. This acquisition operation and also the steady-state control behaviour are described in more detail below. This description is given in particular against the background where both the acquisition operation and the steady-state control behaviour can be disturbed to a considerable extent by the offset $U_{PD0}$ at the output of the phase detector. This offset $U_{PD0}$ is generally temperature-dependent and is composed of the offset of the phase detector 112 and the offset—relative to the phase output—of the loop filter.

The case of frequency acquisition will be discussed first, a negative feedback $V_{u\phi}=0$ and a parasitic gain $V_{up}\neq 0$ being assumed here. $V_{u\phi}$ is the DC component of the frequency response $\underline{U}_{PD}(f)/\underline{U}_v(f)$ of the "VCO phase detector" chain in the locked state of the PLL. The discussion will concern the case without an offset, that is to say $U_{PD0}=0$. With a non-locked loop, the search generator 118 has to oscillate. For this purpose in the positive feedback path, which corresponds to the backward path 120 of the search generator 118 is provided with a Wien bridge tuned to the search frequency $f_S$. The Wien bridge has a voltage gain ⅓ for $f_S$. The oscillation build-up condition $$\frac{|\underline{V}_{uF}(f) \cdot (\underline{V}_{uM}(f) + \underline{V}_{up}(f))|}{\underline{V}_{uRges}(f)} > 1 \tag{1}$$

for $f=f_D$ where $\arg(\underline{V}_S(f_D))=0$ of the search generator 118 is thus met for $\epsilon > \epsilon_{min}$, where $$\varepsilon_{\min} := 3\left(\frac{1}{|\underline{V}_{uF}(f_S)|} - V_{up}\right) \tag{2}$$

It can be sent that the parasitic feedback $V_{up}$ of the search generator 118 has an effect during the frequency acquisition. With regard to magnitude and sign, $V_{up}$ is dependent on the power of the VCO 110 parametres of the particular semiconductor devices used to construct the phase detector, and the frequency of the VCO 110. The parasitic feedback $V_{up}$ can therefore effect either a negative feedback or a positive feedback.

Figure 2:
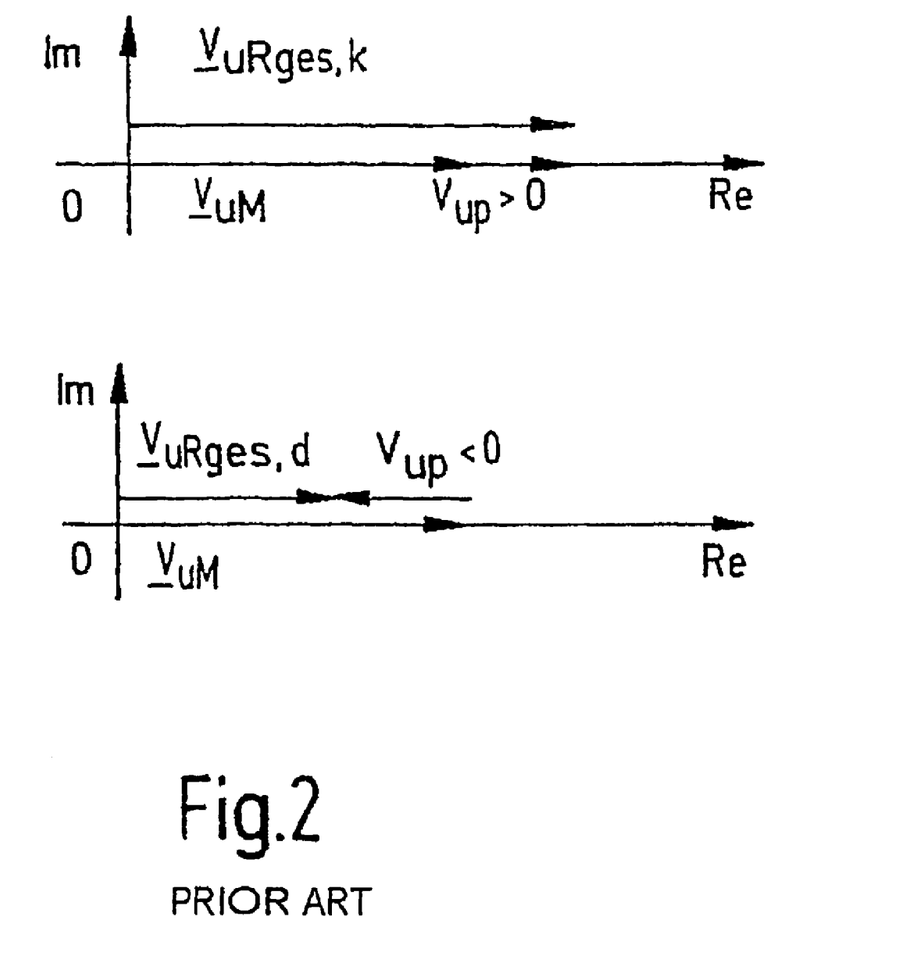
FIG. 2 is a diagram for explaining the operation of the apparatus of the prior art.

These conditions are illustrated in FIG. 2. In the upper diagram in FIG. 2, the parasitic feedback $V_{up}$ acts constructively during the frequency acquisition so that the positive feedback $\underline{V}_{uM}$ is increased by the value $V_{up}$ to $\underline{V}_{uRges,k}$. In contrast to this, the parasitic feedback $V_{up}$ acts destructively in the lower diagram in FIG. 2.

Consequently, the positive feedback $\underline{V}_{uM}$ is reduced by $V_{up}$ to $\underline{V}_{uRges,d}$.

If the offset $U_{PD0}$ is so large that the output of the search generator 118 saturates or limits, that is to say $|U_v|=U_{limit}$, then the search generator will not build up oscillations because $\underline{V}_{uF}(f_S)=0$. For this reason, in addition to the oscillation build-up condition in accordance with equation (2) above, the condition $$|U_{PD0}| < U_{Limit}/V_{uF0} \tag{3}$$

must be met. In this respect, it should be noted that although the limiting condition is also achieved (periodically) with the search generator 118 oscillating in the steady state, it is also left repeatedly due to the charge reversal operations in the Wien bridge.

The case of the steady-state control behaviour i.e. behaviour when the loop is phase locked will be discussed next. The negative feedback $V_{u\phi}$ to the input of VCO 110 is not equal to zero ($V_{u\phi} \neq 0$). The parasitic feedback $V_{up}$ is now equal to zero ($V_{up}=0$). If the tuning voltage of the VCO 110 for $f_{VCO}=f_{Ref}$ lies within the range sought by the search oscillation then the loop can lock. Frequency-dependent network 116 now functions as a loop filter. In this case, the negative feedback $V_{u\phi}$ of the phase-locked loop becomes effective and stops oscillation of the search generator 118. If the output voltage range $[-U_{limit}; +U_{limit}]$ of the loop filter is to allow for the temperature drift of the frequency of the VCO 110, then an operating point range in accordance with equation (3) must be ensured at the phase detector 112.

Figure 3:
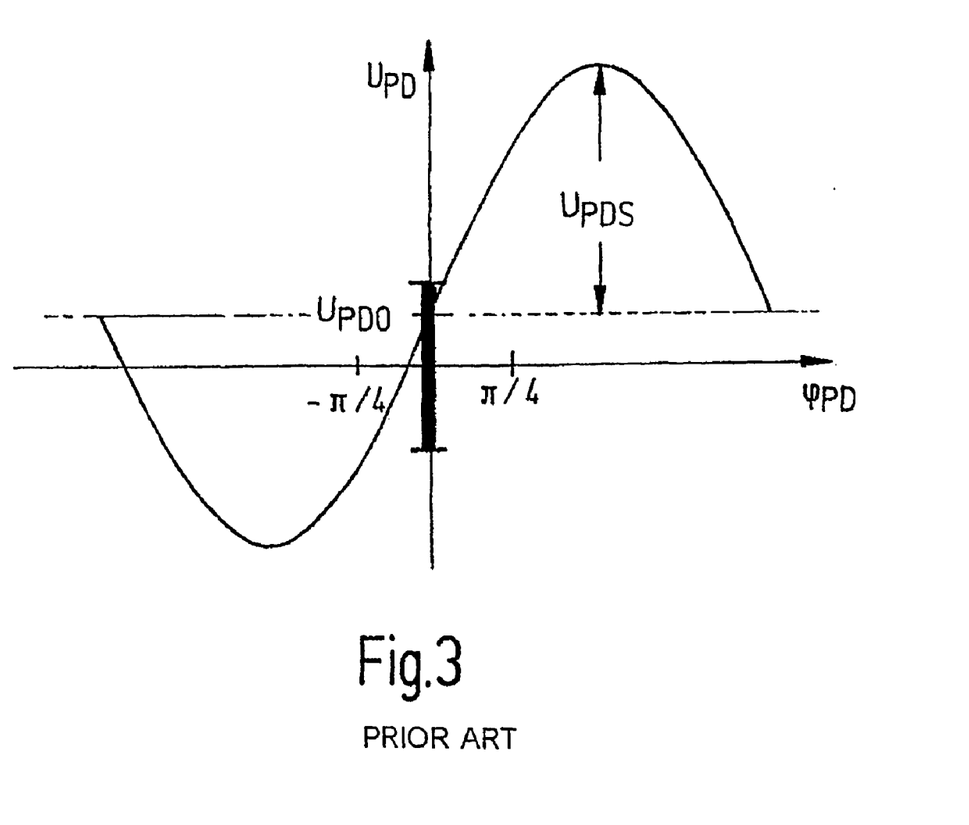
FIG. 3 is a phase detector characteristic curve with operating points for explaining the operation of apparatus of the prior art.

These conditions can be illustrated with reference to FIG. 3, where the phase detector voltage $U_{PD}$ is plotted against the phase $\phi_{PD}$. The instantaneous volume of the signal voltage $U_{PDS}$ oscillates about the offset $\phi_{PD0}$ by the amount $U_{PD}s$.

For reliable operation of the single-loop PLL, the condition $$|\phi_{PD0}|<\pi/4 \quad (4)$$

should furthermore be imposed on the operating point. The permissible operating point range thereby defined is illustrated by the bar on the axis $U_{PD}$ in FIG. 3. Condition (4) is to be complied with in the entire operating temperature range of the VCO, in order that the loop gain of the closed control loop is not reduced to great extent. This loop gain is proportional to the gradient of the tangent of the characteristic curve in FIG. 3. It follows from FIG. 3 that the following condition is to be complied with at the phase detector:

$$|U_{PD0}|+U_{Limit}/V_{uF0}<\pi/4 \cdot U_{PDS} \quad (5)$$

Thus, reliable locking in the sense of equation (5) above is only possible if, at the same time, the conditions in accordance with the equations (2), (3) and (5) above are met:

(2) Dynamic oscillation build-up condition in accordance with equation (2):

$\epsilon > \epsilon_{min}$, $\epsilon_{min}$ in accordance with equation 2

(3) static oscillation build-up condition in accordance with equation (3):

$$|U_{PD0}|<U_{limit}/V_{uF0}$$

(5) reliable operation point of the phase detector in accordance with equation (5):

$$|U_{PD0}|+U_{limit}/V_{uF0}<\pi/4 \cdot U_{PDS}$$

It follows from the above condition in accordance with equation (3) that the second addend in the condition in accordance with equation (5) must be at least as large as the first addend. In other words: the operating point change $U_{limit}/V_{uF0}$ of the phase detector for generating the required tuning voltage range $[-U_{limit}; +U_{limit}]$ at the VCO 110 is at least as large as the offset error $U_{PD0}$ of the phase detector 112.

SUMMARY OF THE INVENTION

The present invention seeks to provide an arrangement in which the disadvantages of the prior art are at least ameliorated.

The invention builds on the apparatus of the generic type by providing means for automatically symmetrizing the search signal. That is to say, any dc component of the search signal is automatically cancelled out so that the search signal oscillates symmetrically. The loop filter, which simultaneously represents the forward path of the search generator, is changed relative to the loop filter of the prior art in such a way that the static oscillation build-up condition described above no longer has to be complied with. The DC voltage gain $V_{uF0}$ of the loop filter is now permitted to be as large as desired. Without further measures, a search generator realized with this filter would not build up oscillations, since its output voltage would be limited in a manner governed by the arbitrarily high gain of the offset error $U_{PD0}$. Therefore, auto-symmetrization of the search generator is realized, which compensates for the offset error $U_{PD0}$ during the frequency acquisition and thus leads to a symmetrically oscillating search signal. Further advantages of the invention emerge from the fact that the second addend of equation (5) represented above is now permitted to become as small as desired. For reliable locking, given the same offset $U_{PD0}$, now only half the "beatnote" $U_{PDs}$ (cf. FIG. 3) is required. This means that the loop can operate at correspondingly higher RF frequencies with the same phase detector. Furthermore, it is worthy of note that the frequency changes of the voltage-controlled oscillator (VCO) can be corrected to as great an extent as desired depending on the size of the $V_{uF0}$. The consequence of this is that different tuning voltages, for example due to a channel change or temperature response of the VCO, practically no longer have any effects on the operation point of the phase detector. The tuning voltage range for the VCO which can be generated on the basis of the invention is practically no longer subject to any restrictions, so that a VCO frequency range which is as large as desired can be sought for the frequency acquisition. By way of example, a tuning voltage range of $\pm 10$ V generates, by means of the customary DC voltage gain of an operational amplifier of 120 dB at the phase detector, a shift in the operation point of less than $10 \text{ V}/10^{(120/20)}=10$ µV. Although commercially available synthesizer ICs with a digital frequency/phase detector and current source output offer comparable properties with regard to capture and steady-state control behaviour, they are nonetheless currently available only for RF input frequencies of up to about 5 GHz. Furthermore, on account of the principle of frequency division, they lead to considerably higher phase noise and generally allow only significantly smaller loop bandwidths. The realization outlay compared with the above-described apparatus of the prior art consists in the additional installation of a few AF (audio frequency) components. However, this extra outlay is insignificant in comparison with the advantages afforded by the present invention, in particular on account of the integrability of the AF components.

In the case of the apparatus according to the invention, it may prove to be advantageous that a parasitic feedback which acts during the frequency acquisition is effective. This applies in particular in connection with the embodiments described below, which ensure that the parasitic feedback which acts during the frequency acquisition acts constructively on the positive feedback of the search generator under all circumstances.

In this connection, it is particularly advantageous, for example, that forward path of the search generator effects a phase shift of about –90° during the generation of the search signal, and that the backward path of the search generator effects a phase shift of about +90° during the generation of the search signal. This enables the parasitic feedback to be added to the positive feedback in complex fashion during the frequency acquisition. Consequently, a resultant vector whose magnitude is greater than that of the output quantities is always produced, that is to say independently of the sign of the parasitic feedback. The consistently produced phase shift is compensated for by the frequency-dependent dependent search generator positive feedback by means of corresponding variation of the search frequency.

It is preferred for the forward path of the search generator to have an operational amplifier with capacitive feedback. This is a very simple circuit for realizing a phase shift of about –90° in the forward path of the search generator.

The apparatus is advantageously developed by virtue of the fact that the means for automatic symmetrization have a comparator and a low-pass filter. The comparator serves for determining whether it is necessary to generate at the low-pass filter an offset which compensates for the offset at the input of the forward path of the search generator. The automatic symmetrization of the search signal is produced in this way.

In this connection, it is particularly advantageous that the comparator effects a voltage rise at the low-pass filter if the output voltage of the forward path of the search generator lies outside a predetermined voltage interval, as a result of which the offset at the input of the forward path of the search generator is compensated for and the output voltage of the forward path of the search generator assumes a value within the predetermined voltage interval, and that the comparator effects no voltage rise at the low-pass filter if the output voltage of the forward path of the signal generator lies within the predetermined voltage interval. During the frequency acquisition, the comparator will thus generally bring about at the low-pass filter a voltage rise which gradually compensates for the offset at the input of the forward path of the search generator. As soon as the output voltage of the forward path of the search generator lies within the predetermined interval, the comparator switches the compensation to "hold" and no further driving of the low-pass filter takes place.

The apparatus according to the invention is advantageously developed by virtue of the fact that the low-pass filter has a capacitor, that the capacitor acts as holding capacitor if the comparator effects no voltage rise at the low-pass filter, that the forward path of the search generator is fetched from the limitation, as a result of which the search generator can first build up oscillations, and that, with the search generator oscillating, before the phase acquisition, a discharge of the holding capacitor is compensated for by a charging current with a duty ratio which differs slightly from one, if the time constant $\tau=RC_H$ of the low-pass filter is large enough.

The apparatus is advantageously designed in such a way that, after the phase acquisition, the holding capacitor is discharged, and that the discharge of the holding capacitor is compensated for by an operating-point shift. At the end of this operating-point shift, the autosymmetrization voltage which has been used for the compensation of the offset is zero, and the operating point generally lies at a phase not equal to zero.

The invention builds on the method of the generic type by virtue of the fact that the search signal is automatically symmetrized. What can thus be achieved is that the static oscillation build-up condition described in connection with the prior art no longer has to be complied with. Rather, the DC voltage gain $V_{uF0}$ is now permitted to become as large as desired.

The method according to the invention can advantageously be employed if a parasitic feedback is effected during the frequency acquisition. Such a parasitic feedback may be advantageous, in particular in connection with the embodiments described below, with regard to a phase shift in that it affects the positive feedback of the search generator constructively under all circumstances.

The method according to the invention is advantageously developed particularly by virtue of the fact that the forward path of the search generator effects a phase shift of about –90° during the generation of the search signal, and that the backward path of the search generator effects a phase shift of about +90° during the generation of the search signal. The parasitic feedback is thus added to the positive feedback in complex fashion. In this way, a constructive contribution of the parasitic feedback to the positive feedback is always produced.

Preferably, the phase shift of the forward path of the search generator is effected by an operational amplifier with capacitive feedback. A phase shift of about –90° is thus realized in the forward path of the search generator in a simple manner.

It may likewise be beneficial that a comparator and a low-pass filter are used for automatically symmetrizing the search signal. The automatic symmetrization is thus produced since the comparator can determine whether it is necessary to generate at the low-pass filter an offset which compensates for the offset at the input of the forward path of the search generator.

The method according to the invention is particularly advantageously developed by virtue of the fact that the comparator effects a voltage rise at the low-pass filter if the output voltage of the forward path of the search generator lies outside a predetermined voltage interval, as a result of which the offset voltage at the input of the forward path of the search generator is compensated for and the output voltage of the forward path of the search generator assumes a value within the predetermined voltage interval, and that the comparator effects no voltage rise at the low-pass filter if the output voltage of the forward path of the search generator lies within the predetermined voltage interval. The capacitor can thus act as charging capacitor or as holding capacitor, depending on the output voltage of the forward path of the signal generator.

The method is likewise advantageous by virtue of the fact that the low-pass filter has a capacitor, that the capacitor acts as holding capacitor if the comparator effects no voltage rise at the low-pass filter, and that, with the search generator oscillating, before the phase acquisition, a discharge of the holding capacitor is compensated for by a charging current with a duty ratio which differs slightly from one. The capacitor can maintain the set compensation of the offset given a suitable time constant of the low-pass filter for many periods of the search generator oscillation. In the steady-state condition, the discharge of the holding capacitor can be compensated for by a duty ratio of the charging current which differs slightly from one.

The method is likewise beneficial by virtue of the features that, after the phase acquisition, the holding capacitor is discharged, and that the discharge of the holding capacitor is compensated for by an operating-point shift. The symmetrization voltage is zero at the end of the operating-point shift. The operating point generally lies at a phase not equal to zero.

The invention is based on the insight that the offset error can be compensated for by autosymmetrization of the search generator during the frequency acquisition, which leads to a symmetrically oscillating search signal. This has numerous advantageous effects on the operating quantities of the single-loop PLL, with, in particular, restrictions of the individual operating parameters being avoided.

BRIEF DESCRIPTION OF THE DRAWINGS

The invention will now be explained by way of example using preferred embodiments with reference to the accompanying drawings.

In the figures.

DETAILED DESCRIPTION OF THE PREFERRED EMBODIMENTS

Figure 4:
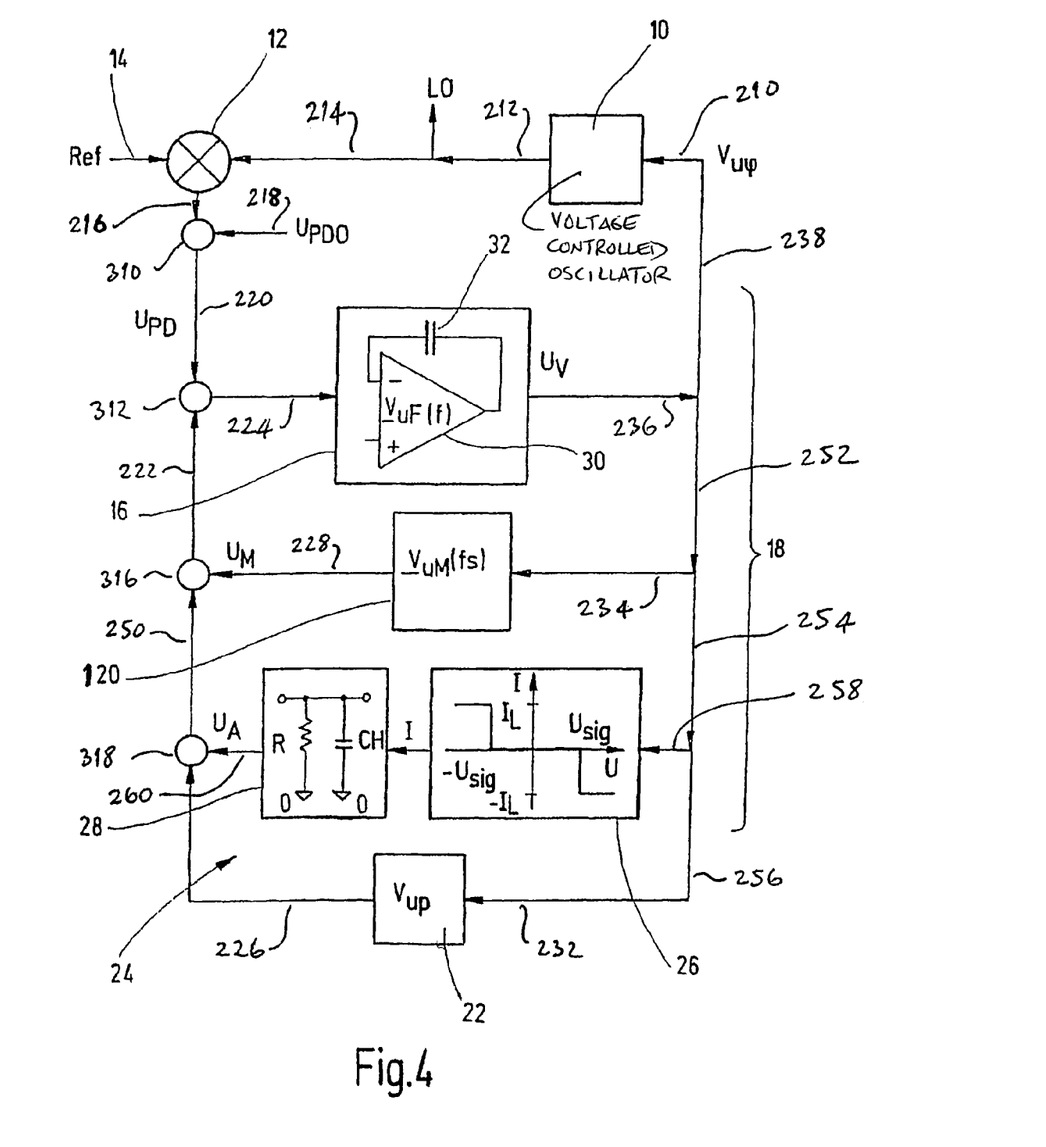
FIG. 4 is a block diagram of an embodiment of the invention.

FIG. 4 shows a block diagram of an embodiment of an apparatus according to the invention. Items which are identical with those of the arrangement of FIG. 1 have been given identical reference numerals. The single-loop PLL illustrated comprises a voltage-controlled oscillator (VCO) 10 for generating a local oscillator signal (LO). The output of the VCO 10 is coupled to a phase detector 12. This phase detector 12 furthermore receives a reference signal 14. The output voltage $U_{PD}$ of the phase detector is fed to the input of a frequency responsive network 16 which functions both as the forward path of a search generator 18 during frequency acquisition and as a loop filter for the phase locked loop once lock has been attained. The output voltage $U_V$ of the forward path 16 of the search generator 18 is returned to the input of the VCO 10. Furthermore, the output voltage $U_V$ of the forward path 16 of the search generator 18 is fed to a backward path 20 of the search generator. The output voltage $U_M$ of the backward path 20 of the search generator 18 is passed to the input of the forward path 16 of the search generator 18. Furthermore, means 24 for automatically symmetrizing the search signal are provided. The means 24 for automatic symmetrization comprise a comparator 26 and a low-pass filter 28. The output voltage of the forward path 16 of the search generator 18 is passed to the input of the comparator 26. An output signal of the comparator 26 drives the low-pass filter 28. The low-pass filter 28 comprises, a resistor R and a holding capacitor $C_H$. The autosymmetrization voltage $U_A$ is obtained at the output of the low-pass filter and is returned to the input of the forward path 16 of the search generator 18. Furthermore, a parasitic feedback 22 is illustrated, which is effective during the frequency acquisition.

The loop filter illustrated is dimensioned in such a way that the forward path 16 of the search generator 18 effects a phase shift of about −90° at the search frequency $f=f_S$. For this purpose, a simple circuit having an operational amplifier 30 and a capacitor 32 is preferably used. The operational amplifier 30 has purely capacitive feedback connected between its output and its inverting input. In this way, the desired high value $V_{uF0}$ is obtained at the same time. The backward path 120 of the search generator 18 is designed in such a way that it satisfies the oscillation build-up condition in accordance with equation (1) at the search frequency $f=f_S$. Its phase shift is then +90°.

The functional principle of the arrangement is described below with reference to the temporal sequence of the frequency and phase acquisition. For the purpose of simplifying the explanation of operation the VCO will be described as tuning ON after the symmetrization operation has been completed, in practice the VCO will produce an output signal as soon as power is applied thereto. The skilled person will appreciate that, when the VCO is not frequency detected to the reference frequency, the DC component of the output of the discriminator 112 will be largely independent of the absolute value of the output frequency of the VCO. Very unfavourable boundary conditions will be assumed in this case. The real acquisition operation proceeds more simply, and it will generally take place within half a period of the search generator oscillation.

Firstly, it is assumed that the output voltage $U_v(t)$ of the search generator 18, which acts as a loop filter after the phase acquisition, is in limitation $|U_v(t)|=U_{limit}$. Furthermore, the VCO 10 is initially still switched off. It then holds true that $\underline{V}_{uF0}(f)=0$, and the search generator 18 will not build up oscillations owing to lack of loop gain.

In this state, the comparator 26 will bring about a voltage rise at the low-pass filter 28. This voltage rise gradually compensates for the offset $U_{PD0}$ at the input of the search generator 18. As soon as the output voltage satisfies the condition $|U_v(t)|<U_{sig}$, the comparator switches the compensation to "hold" (I=0). If the low-pass filter satisfies the condition $$\tau := R \cdot C_H \gg 1/(2\pi f_S) \qquad (8)$$

then the holding capacitor $C_H$ maintains this compensation for many periods of the search generator oscillation. Given suitable dimensioning, the following holds true:

The autosymmetrization voltage $U_A(t)$ averaged over $T_S=1/f_S$ will change until the search generator 18 oscillates almost symmetrically, that is to say without a DC voltage component, even in the event of a great offset. In this steady-state condition, the discharge of $C_H$ is compensated for by a duty ratio of the charging current which differs slightly from one.

This results in a steady-state control movement $U_A(t)$ with an AC component of the frequency $f=f_S$. The said component remains small relative to the output signal $U_M(t)$, the actual search generator positive feedback $\underline{V}_{uM}(f)$. Consequently, it influences the search operation only to an insignificant extent. As long as the search generator oscillates, $U_{A,DC}=-U_{PD0}$ holds true for the DC component of the autosymmetrization voltage.

If the VCO 10 now switches on, the loop will lock on in the same manner as the prior art described above. This operation will therefore not be described further.

Directly after the phase acquisition, which proceeds within approximately the inverse PLL bandwidth, the following holds true for the operating point of the phase detector: $\phi_{PD}=0$, that is to say $U_{PD}=U_{PD0}$. The tuning voltage of the VCO 10 now meets the condition $|U_v(t)|<U_{sig}$, and the current source at the output of the comparator 26 is thus permanently switched off. Therefore, the holding capacitor $C_H$ of the low-pass filter 28 gradually discharges with the time constant τ mentioned above in equation (8), which the phase detector 12 compensates for with corresponding operating-point shifting.

Figure 5:
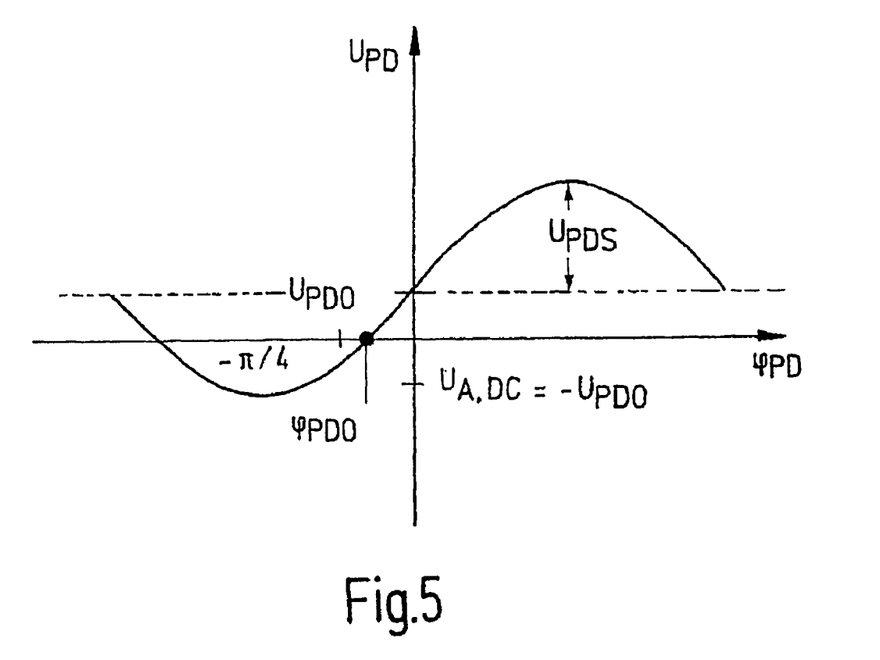
FIG. 5 is a voltage-phase diagram for explaining figuration of FIG. 4.

FIG. 5 illustrates the state which is present after the operation described above. The following hold true:

$U^A(t)=0$ $U_{PD}=0$, that is to say $\phi_{PD}$ has a value such that the following holds true: $U_{PD0}+U_{PDS}\cdot\sin(\phi_{PD0})=0$.

With a locked loop, the forward path 16 of the search generator 18 becomes the integrating loop filter. As long as the tuning voltage remains in the allowed range $[-U_{sig}; +U_{sig}]$, the autosymmetrization remains I active. If the tuning voltage leaves the allowed range, then the search operation begins anew.

Figure 6:
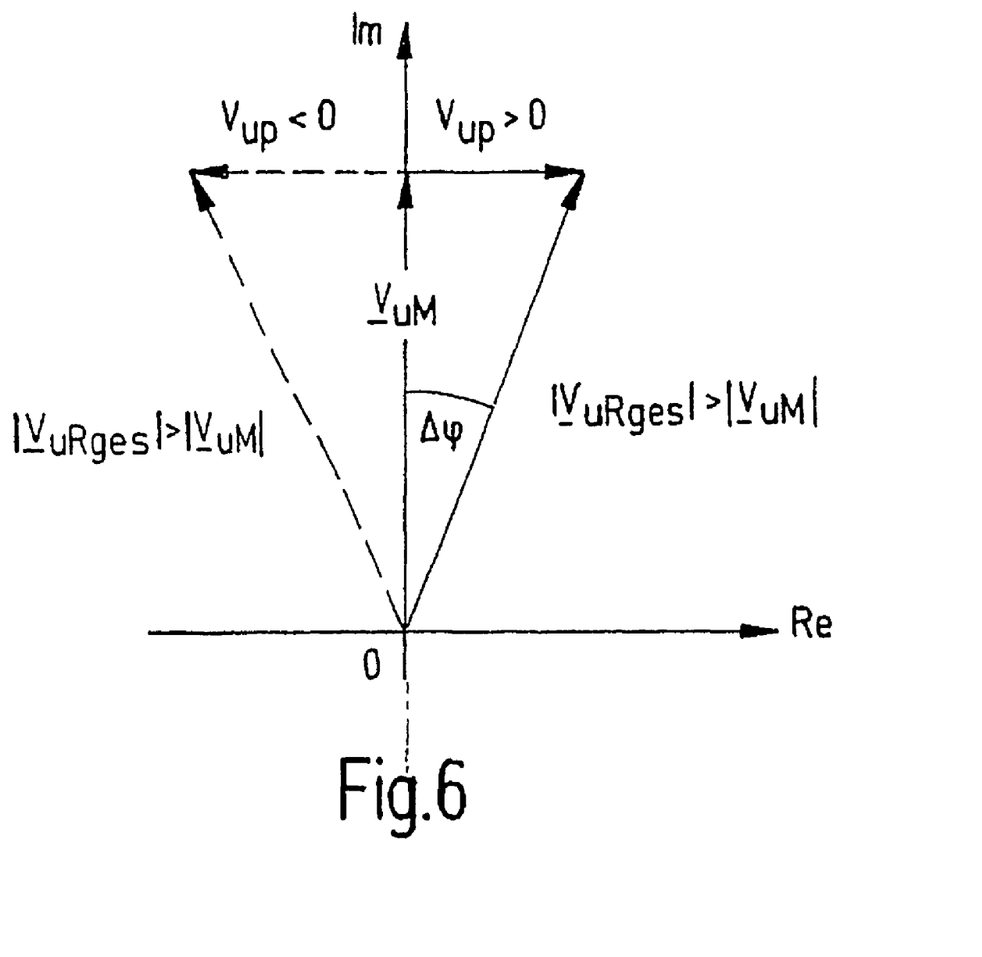
FIG. 6 is a phase detector characteristic curve with operating point for explaining the operation of FIG. 4.

FIG. 6 illustrates the effects of the parasitic feedback 22 (see FIG. 4) during the frequency acquisition. Unlike in the apparatuses of the prior art (see FIGS. 1 and 2), during the frequency acquisition, the parasitic Vup effects a positive feedback of the search generator 18 independently of its sign. It can be seen from FIG. 6 that, independently of the sign of $V_{up}$, the following holds true:

$$\underline{V}_{uRges}|>|\underline{V}_{uM}(f_S)  \quad (9)$$

This means that the search oscillation is additionally excited. In this case, the resulting phase shift Δϕ is compensated for by the frequency-dependent search generator positive feedback $\underline{V}_{uM}(f)$ by means of corresponding variation of the search frequency.

The above description of the exemplary embodiments in accordance with the present invention serves only for illustrative purposes and not for the purpose of restricting the invention. In the context of the invention, various changes and modifications are possible without departing from the scope of the invention and its equivalents.

The invention claimed is:

1. An apparatus for frequency and phase acquisition, comprising: a voltage-controlled oscillator having an oscillator frequency; a search generator receiving a detection signal from a phase detector to generate a search signal to the voltage-controlled oscillator and having a forward path and backward paths for generating said search signal with a DC component and a search frequency, a loop filter in the forward path of the search generator for locking the frequencies; means in the forward path for effecting a phase shift of about −90° during generation of the search signal, and means in a first backward path of said backward paths for effecting a phase shift of about +90° during generation of the search signal; and means in a second backward path of said backward paths for automatically canceling the DC component of the search signal.

2. The apparatus according to claim 1, wherein the means for effecting the phase shift of −90° comprises an operational amplifier with capacitive negative feedback.

3. The apparatus according to claim 1, wherein the means for canceling comprise a comparator and a low-pass filter.

4. The apparatus according to claim 3, wherein the comparator is arranged to effect a voltage rise at the low-pass filter if an output voltage of the forward path of the search generator lies outside a predetermined voltage interval, and wherein the comparator raises the output voltage of the forward pat of the search generator to a value within the predetermined voltage interval, and wherein the comparator effects no rise in the output voltage at the low-pass filter if the output voltage of the forward path of the search generator lies within the predetermined voltage interval.

5. The apparatus according to claim 4, wherein the low-pass filter has a capacitor that is arranged to act as a holding capacitor if the comparator effects no rise in the output voltage at the low-pass filter, and further comprising, before the phase acquisition, charging current means operatively connected to the holding capacitor for compensating for a discharge of the holding capacitor, the charging current means comprising an alternating current source having a duty ratio which differs slightly from unity.

6. The apparatus according to claim 5, further comprising discharge means operatively connected to the holding capacitor for at least partially discharging the holding capacitor after phase acquisition.

7. An apparatus for frequency and phase acquisition, comprising: a voltage-controlled oscillator having an oscillator frequency; a search generator receiving a detection signal from a phase detector to generate a search signal to the voltage-controlled oscillator and having a forward path and backward paths for generating said search signal with a DC component and a search frequency, a loop filter in the forward path of the search generator for locking the frequencies; and means in a first backward path of said backward paths for automatically canceling the DC component of the search signal, the canceling means including a comparator and a low-pass filter.

8. The apparatus according to claim 7, and further comprising means in the forward path for effecting a phase shift of about −90 ° during generation of the search signal, and further comprising means in a second backward path of said backward paths for effecting a phase shift of about +90° during generation of the search signal.

9. The apparatus according to claim 8, wherein the means for effecting the phase shift of −90° comprises an operational amplifier with capacitive negative feedback.

10. The apparatus according to claim 7, wherein the comparator is arranged to effect a voltage rise at the low-pass filter if an output voltage of the forward path of the search generator lies outside a predetermined voltage interval, and wherein the comparator raises the output voltage of the forward path of the search generator to a value within the predetermined voltage interval, and wherein the comparator effects no rise in the output voltage at the low-pass filter if the output voltage of the forward path of the search generator lies within the predetermined voltage interval.

11. The apparatus according to claim 10, wherein the low-pass filter has a capacitor that is arranged to act as a holding capacitor if the comparator effects no rise in the output voltage at the low-pass filter, and further comprising, before the phase acquisition, charging current means operatively connected to the holding capacitor for compensating for a discharge of the holding capacitor, the charging current means comprising an alternating current source having a duty ratio which differs slightly from unity.

12. The apparatus according to claim 11, further comprising discharge means operatively connected to the holding capacitor for at least partially discharging the holding capacitor after phase acquisition.

13. An apparatus for frequency and phase acquisition, comprising: a voltage-controlled oscillator having an oscillator frequency; a search generator receiving a detection signal from a phase detector to generate a search signal to the voltage-controlled oscillator and having a forward path and backward paths for generating said search signal with a DC component and a search frequency, a loop filter in the forward path of the search generator for locking the frequencies; and means in a first backward path of said backward paths for automatically canceling the DC component of the search signal, the canceling means including a comparator and a low-pass filter, the comparator being arranged to effect a voltage rise at the low-pass filter if an output voltage of the forward path of the search generator lies outside a predetermined voltage interval, and the comparator raising the output voltage of the forward path of the search generator to a value within the predetermined voltage interval, and the comparator effecting no rise in the output voltage at the low-pass ifiter if the output voltage of the forward path of the search generator lies within the predetermined voltage interval.

14. The apparatus according to claim 13, wherein the low-pass filter has a capacitor that is arranged to act as a holding capacitor if the comparator effects no rise in the output voltage at the low-pass fitter, and further comprising, before the phase acquisition, charging current means operatively connected to the holding capacitor for compensating for a discharge of the holding capacitor, the charging current means comprising an alternating current source having a duty ratio which differs slightly from unity.

15. The apparatus according to claim 14, further comprising discharge means operatively connected to the holding capacitor for at least partially discharging the holding capacitor after phase acquisition.

16. The apparatus according to claim 13, and further comprising means in the forward path for effecting a phase shift of about −90° during generation of the search signal, and further comprising means in a second backward path of said backward paths for effecting a phase shift of about +90° during generation of the search signal.

17. The apparatus according to claim 16, wherein the means for effecting the phase shift of −90° a comprises an operational amplifier with capacitive negative feedback.

* * * * *

UNITED STATES PATENT AND TRADEMARK OFFICE
CERTIFICATE OF CORRECTION

PATENT NO. : 7,088,157 B2
APPLICATION NO. : 10/477035
DATED : August 8, 2006
INVENTOR(S) : Kirsch It is certified that error appears in the above-identified patent and that said Letters Patent is hereby corrected as shown below:

In Fig. 4, Sheet 4 of 6, for Tag "28", delete "CH" and insert -- $C_H$ --, therefor.

In Column 1, Line 41, delete "analysis." and insert -- analysis, --, therefor.

In Column 2, Line 41, in Equation (2), delete " $3\left(\dfrac{1}{|V_{uF}(f_s)|} - V_{up}\right)$ " and insert -- $3\left[\dfrac{1}{|V_{uF}(f_s)|} - V_{up}\right]$ --, therefor.

In Column 2, Line 63, delete "$\underline{V}_{uF}(fs)=0$." and insert -- $\underline{V}_{uF}(f_s)=0$. --, therefor.

In Column 3, Line 24, delete "$\Phi_{PD0}$" and insert -- $U_{PD0}$ --, therefor.

In Column 5, Lines 12-13, delete "dependent" before "search".

In Column 9, Line 10, delete "$U^A(t)=0$" and insert -- $U_A(t)=0$ --, therefor.

In Column 9, Line 27, in Equation (9), delete "$\underline{V}_{uRges}|>|\underline{V}_{uM}(f_s)$" and insert -- $|\underline{V}_{uRges}|>|\underline{V}_{uM}(f_s)|$ --, therefor.

In Column 9, Line 65, in Claim 4, delete "pat" and insert -- path --, therefor.

UNITED STATES PATENT AND TRADEMARK OFFICE
CERTIFICATE OF CORRECTION

PATENT NO.        : 7,088,157 B2
APPLICATION NO. : 10/477035
DATED             : August 8, 2006
INVENTOR(S)       : Kirsch It is certified that error appears in the above-identified patent and that said Letters Patent is hereby corrected as shown below:

In Column 11, Line 11, in Claim 13, delete "ifiter" and insert -- filter --, therefor.

In Column 11, Line 17, in Claim 14, delete "fitter," and insert -- filter, --, therefor.

In Column 12, Lines 13-14, in Claim 16, delete "+90 °" and insert -- +90° --, therefor.

In Column 12, Line 16, in Claim 17, delete "a comprises" and insert -- comprises --, therefor.

Signed and Sealed this

Thirty-first Day of March, 2009

JOHN DOLL
*Acting Director of the United States Patent and Trademark Office*